US006665201B1

(12) United States Patent
Spencer et al.

(10) Patent No.: US 6,665,201 B1
(45) Date of Patent: Dec. 16, 2003

(54) DIRECT CONNECT SOLID-STATE STORAGE DEVICE

(75) Inventors: Andrew M. Spencer, Eagle, ID (US); Thomas C. Anthony, Sunnyvale, CA (US); Colin A. Stobbs, Boise, ID (US); Sarah M. Brandenberger, Boise, ID (US); Steven C. Johnson, Eagle, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/202,051

(22) Filed: Jul. 24, 2002

(51) Int. Cl.[7] .............................................. G11C 19/08
(52) U.S. Cl. .......................... 365/1; 365/66; 365/158; 365/173; 361/728; 361/730; 361/752; 439/76.1; 439/660; 705/2
(58) Field of Search ............................... 365/1, 66, 158, 365/173; 439/660, 76.1; 361/728, 730, 752; 705/2

(56) References Cited

U.S. PATENT DOCUMENTS

| 6,034,902 A | * | 3/2000 | Zettler et al. ............... 365/195 |
| 6,169,686 B1 | * | 1/2001 | Brug et al. .................. 365/171 |
| 6,257,930 B1 | * | 7/2001 | Yu .............................. 439/607 |
| 6,570,783 B1 | * | 5/2003 | Deak ........................... 365/158 |
| 2002/0128865 A1 | * | 9/2002 | Alten ............................. 705/2 |
| 2003/0005337 A1 | * | 1/2003 | Poo et al. .................... 713/202 |

* cited by examiner

Primary Examiner—Michael S. Lebentritt
Assistant Examiner—Pho M. Luu

(57) ABSTRACT

The present disclosure relates to a solid-state storage device. In one arrangement, the storage device comprises a memory device comprising one of an atomic resolution storage (ARS) device and a magnetic random access memory (MRAM) device, a controller, and an integral connector that is used to directly connect the storage device to another device.

17 Claims, 7 Drawing Sheets

DIRECT CONNECT SOLID-STATE STORAGE DEVICE

FIELD OF THE INVENTION

The present disclosure relates to a solid-state storage device. More particularly, the present disclosure relates to a solid-state storage device that includes an integral connector that permits the storage device to be directly connected to another device.

BACKGROUND OF THE INVENTION

Solid-state memory devices have increased in popularity in recent years. By way of example, flash memory has come into common use in handheld electronic devices such as digital cameras, music players, and the like. Due to the recent advances in solid-state memory devices, several available devices now comprise enough capacity such that they can be used to produce alternative storage devices that can be used in similar manner to more conventional storage devices such as floppy discs, zip discs, etc.

Unfortunately, most such storage devices require intermediate hardware to connect the storage device to another (e.g., host) device. Although, more recently, some solid-state storage devices have been introduced that are capable of directly connecting to a host device, most such devices either have limited storage capacity or limited transfer rate performance.

From the foregoing, it can be appreciated that it would be desirable to have a storage device that is adapted for direct connection to another device and that offers high storage capacity and/or performance.

SUMMARY OF THE INVENTION

The present disclosure relates to a solid-state storage device. In one arrangement, the storage device comprises a memory device comprising one of an atomic resolution storage (ARS) device and a magnetic random access memory (MRAM) device, a controller, and an integral connector that is used to directly connect the storage device to another device.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

Figure 1:
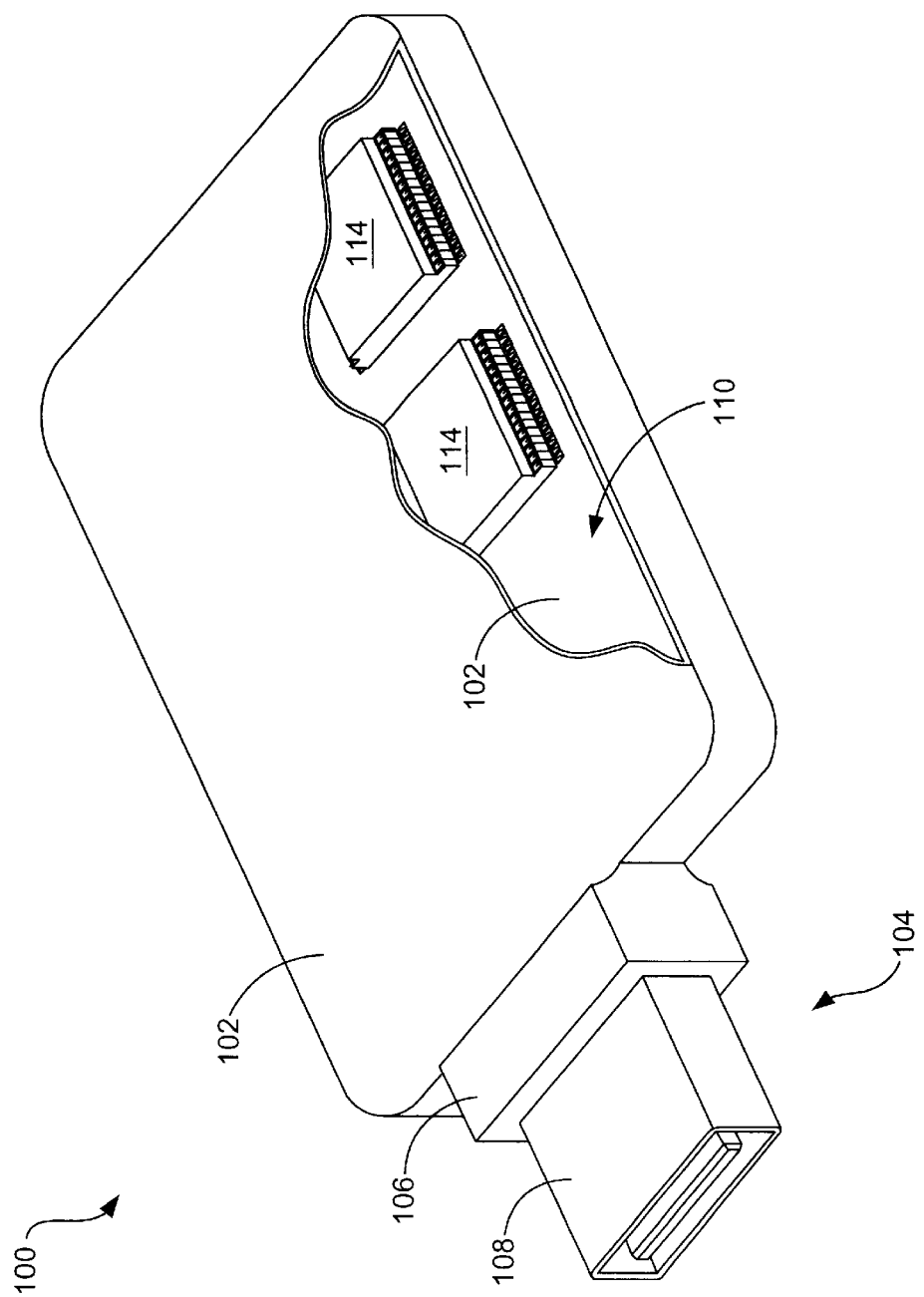
FIG. 1 is a perspective view of an example storage device having an integral connector.
Figure 2:
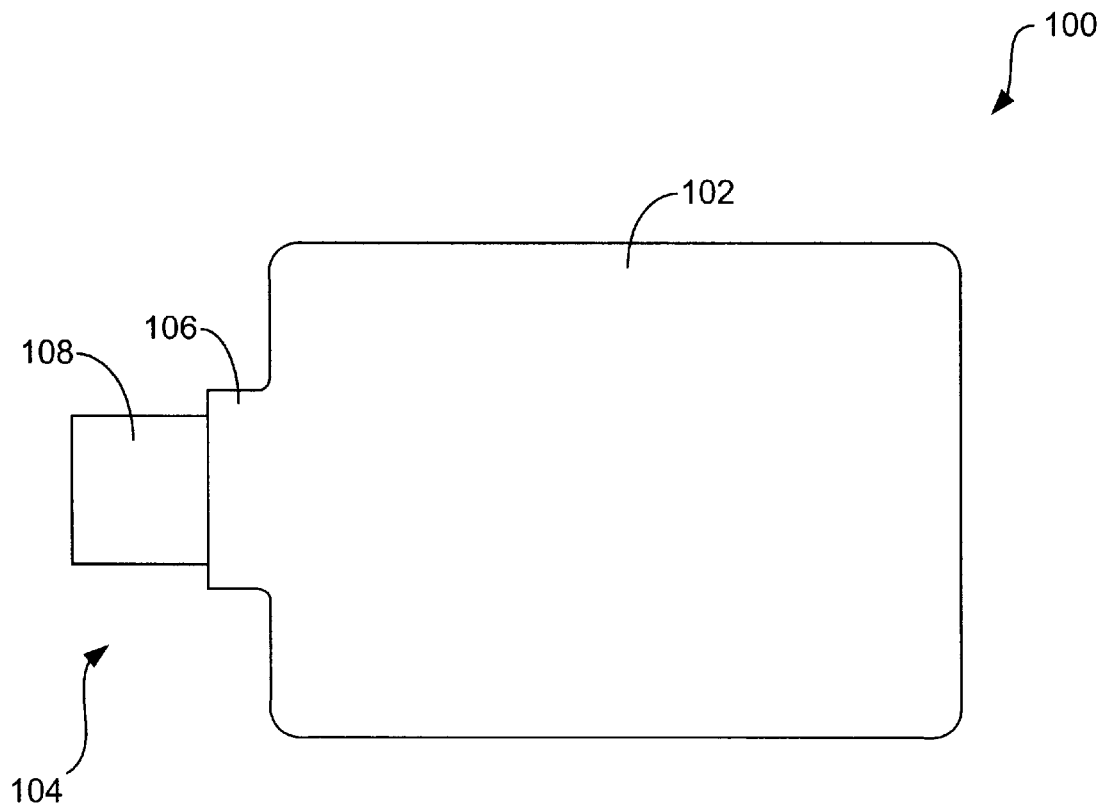
FIG. 2 is a plan view of the storage device shown in FIG. 1.
Figure 3:
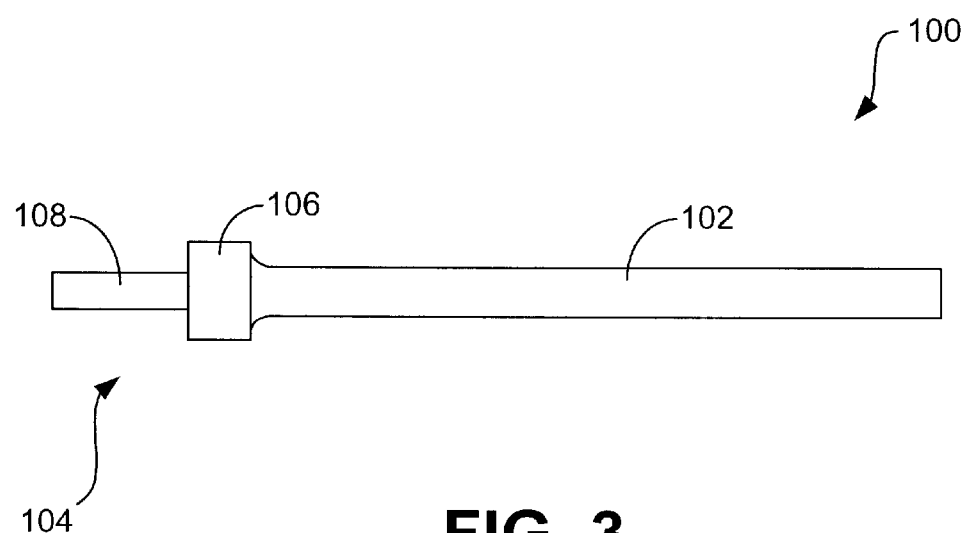
FIG. 3 is a side view of the storage device shown in FIGS. 1 and 2.

Referring now in more detail to the drawings, in which like numerals indicate corresponding parts throughout the several views, FIGS. 1–3 illustrate a storage device 100 that is configured for direct connection to another device, such as a host device. As indicated in FIG. 1, the storage device 100 typically comprises a housing 102 that includes an integral connector 104. Generally speaking, the connector 104 can include an overmold boot 106 and a plug 108. By way of example, the connector 104 comprises a universal serial bus (USB) series "A" plug connector. Although that particular form of connector has been identified herein and illustrated in the figures, persons having ordinary skill in the art will appreciate that alternative types of connectors are feasible including, for instance, SCSI, EIDE, IEEE 1394 (Firewire™), CompactFlash™, MultiMediaCard™, or SecureDigital™.

The housing 102 defines an interior space 110 that contains a printed circuit board (PCB) 112 on which one or more solid-state memory devices 114 are mounted. Although a PCB is illustrated and described herein, persons having ordinary skill in the art will appreciate that alternative mounting technologies could be used such as flex circuits, thick films, etc. Normally, the memory devices 114 are surface mounted to the PCB 112 (on one or both sides) and electrically connected thereto such that each memory device is in electrical communication with the other devices on the board to provide for increased storage capacity. Each of the memory devices 114 typically is small in size so that a plurality of such devices can be provided within the housing 102. For instance, each memory device 114 can have width and length dimensions of approximately 1 centimeter (cm) and a thickness dimension of approximately 1 millimeter (mm). As is discussed in greater detail below, the memory devices 114 preferably comprise atomic resolution storage (ARS) devices or magnetic random access memory (MRAM) devices. By way of example, the storage device 100 can have width, length, and thickness dimensions of approximately 35 cm, 25 cm, and 4 cm, respectively such that the storage device is highly portable.

Figure 4:
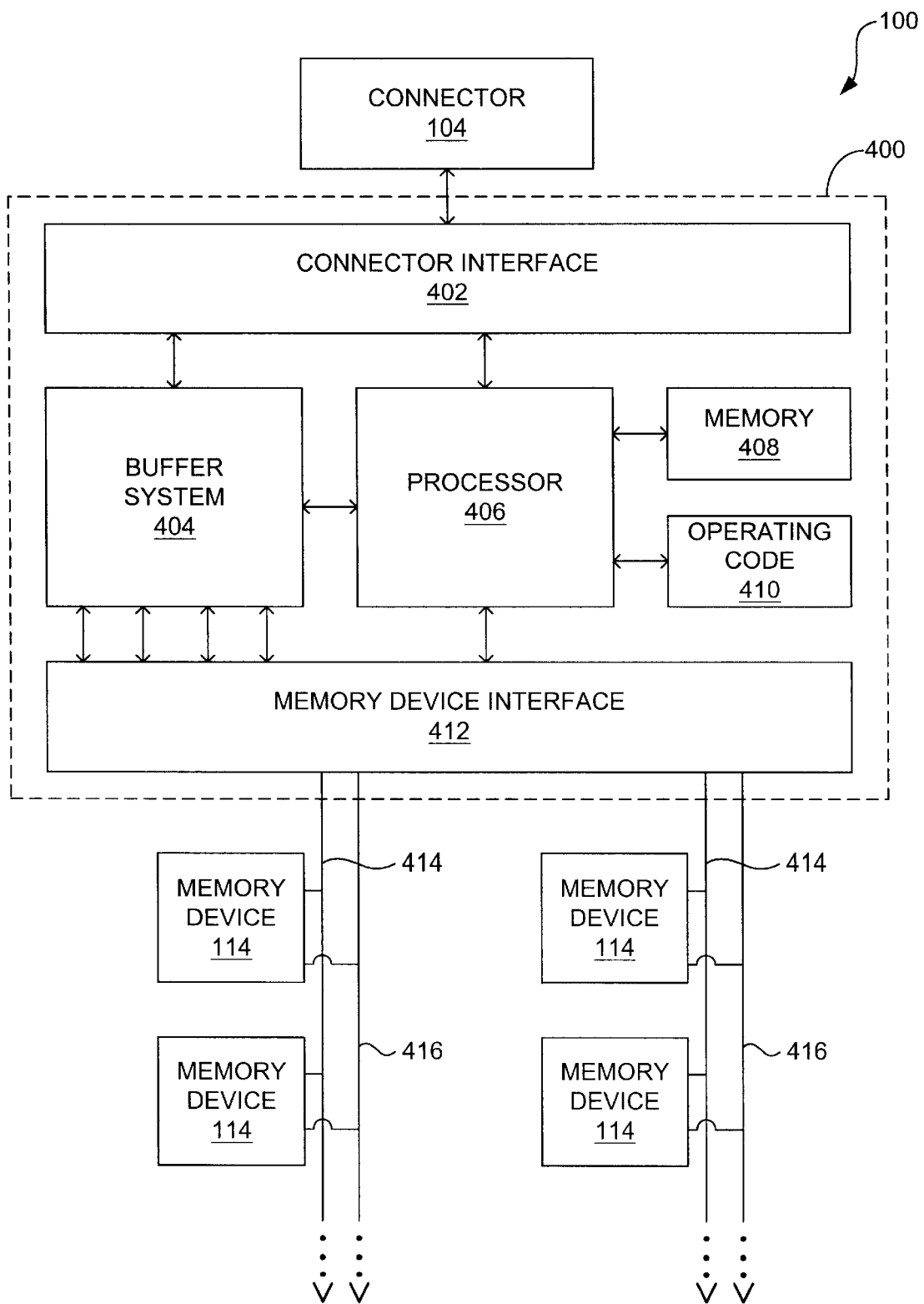
FIG. 4 is a block diagram of the storage device shown in FIGS. 1–3.

FIG. 4 provides a block diagram of the storage device 100. As indicated in this figure, the memory device 100 generally comprises the connector 104, a controller 400, and one or more memory devices 114. The controller 400 typically comprises a semiconductor device that is used to control and manage operation of the storage device 100. By way of example, the controller 400 comprises a connector interface 402, buffer system 404, processor 406, memory 408, operating code 410, and a memory device interface 412. As its name suggests, the connector interface 402 provides an interface between the connector 104 and the controller 400 and therefore is configured to follow the protocol required by the connection scheme. For example, where the connector 104 is a USB connector, the connector interface 402 is a USB interface that sends and receives blocks of data according to a serial differential signaling scheme. The buffer system 404 comprises buffer memory and a buffer manager with which data (e.g., a block of data to be written to a memory device 114) can be received and temporarily stored.

The processor 406 is configured to control operation of the storage device 100 and, in accordance with operating code 410 (e.g., firmware), controls the operation of the other controller components. Although operating code has been identified, processing could, alternatively be conducted by appropriate hardware. The processor 406 is configured to receive storage commands from the connector interface 402 and configure the memory device interface 412 to write one or more blocks of data to a particular storage device address. The memory device interface 412 is configured to interact with the various memory devices 114 using one or more data lines 414 and address and control lines 416 when write and/or read commands are received by the processor 406.

When data is to be written to the storage device 100, a write command is received by the connector interface 402 via the connector 104 is forwarded to the processor 406. The command typically specifies a linear address associated with the data that is to be written along with the number of blocks of data to be written. Following the write command, blocks of data are received by the connector interface 402 (via the connector 104) and any format information required by the interface protocol associated with the blocks of data are processed and removed. The data is buffered in the buffer system 404 and the commands are forwarded to the processor 406. Since the write commands specify linear addresses, the addresses are converted (i.e., mapped) by the processor 406 to an appropriate storage device address. Memory 408 can be used by the processor 406 as a resource when computing. The processor 406 then forwards the storage device address information to the memory device interface 412 and typically simultaneously causes the buffer system 404 to forward the data to be stored at the various addresses to the memory device interface 412. After having received the data to be stored and the storage device address information, the memory device interface 412 reconfigures the data into a format appropriate for the storage device 100 and causes the data to be written to the specified storage device address(es).

During a read, a read command is received by the connector interface 402 via the connector 104 and is forwarded to the processor 406. Again, the command typically specifies a linear address associated with the data that is to be read. The processor 406 maps the linear address to a storage device address and, via the memory device interface 412, fetches the data stored at the relevant storage device address, organizes it into blocks of data, and passes it to the buffer system 404. Once the buffer system 404 receives data (e.g., one or more blocks of data), the data is formatted into the appropriate connector format (e.g., USB format) and is then forwarded to the requesting (e.g., host) device via the connector interface 402 and connector 104.

Figure 5:
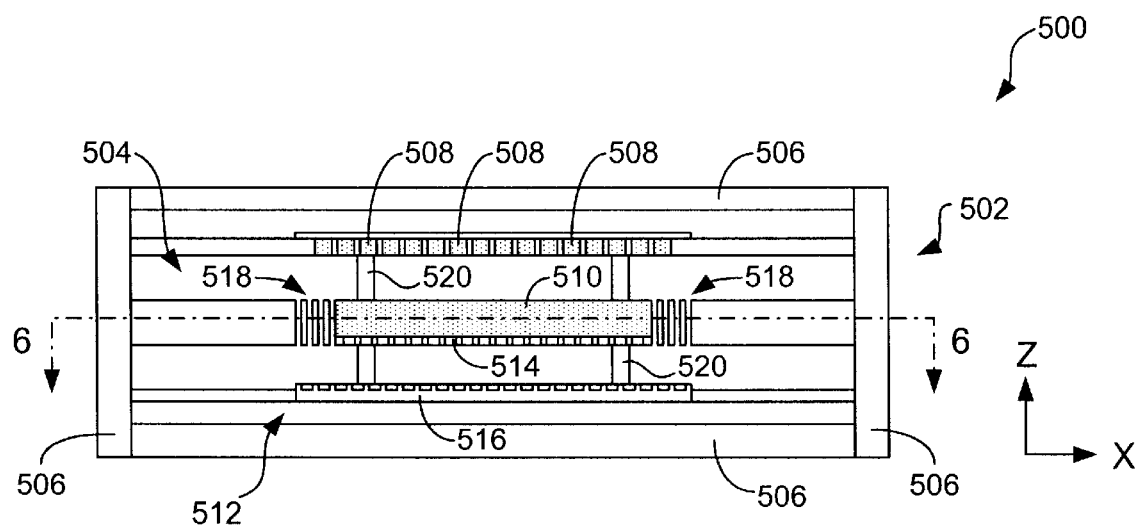
FIG. 5 is a schematic side view of a first example memory device that can be used in the storage device shown in FIGS. 1–4.
Figure 6:
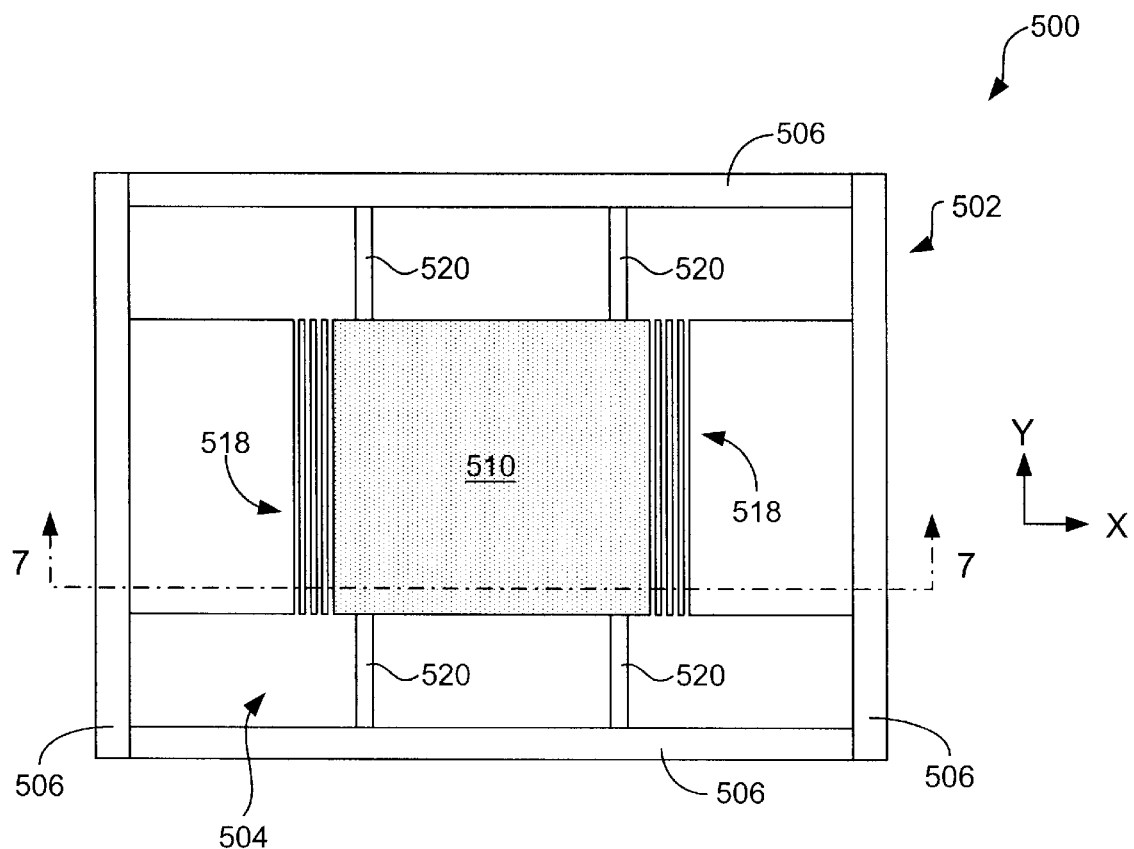
FIG. 6 is a schematic cross-sectional view of the memory device of FIG. 5 taken along line 6—6.
Figure 7:
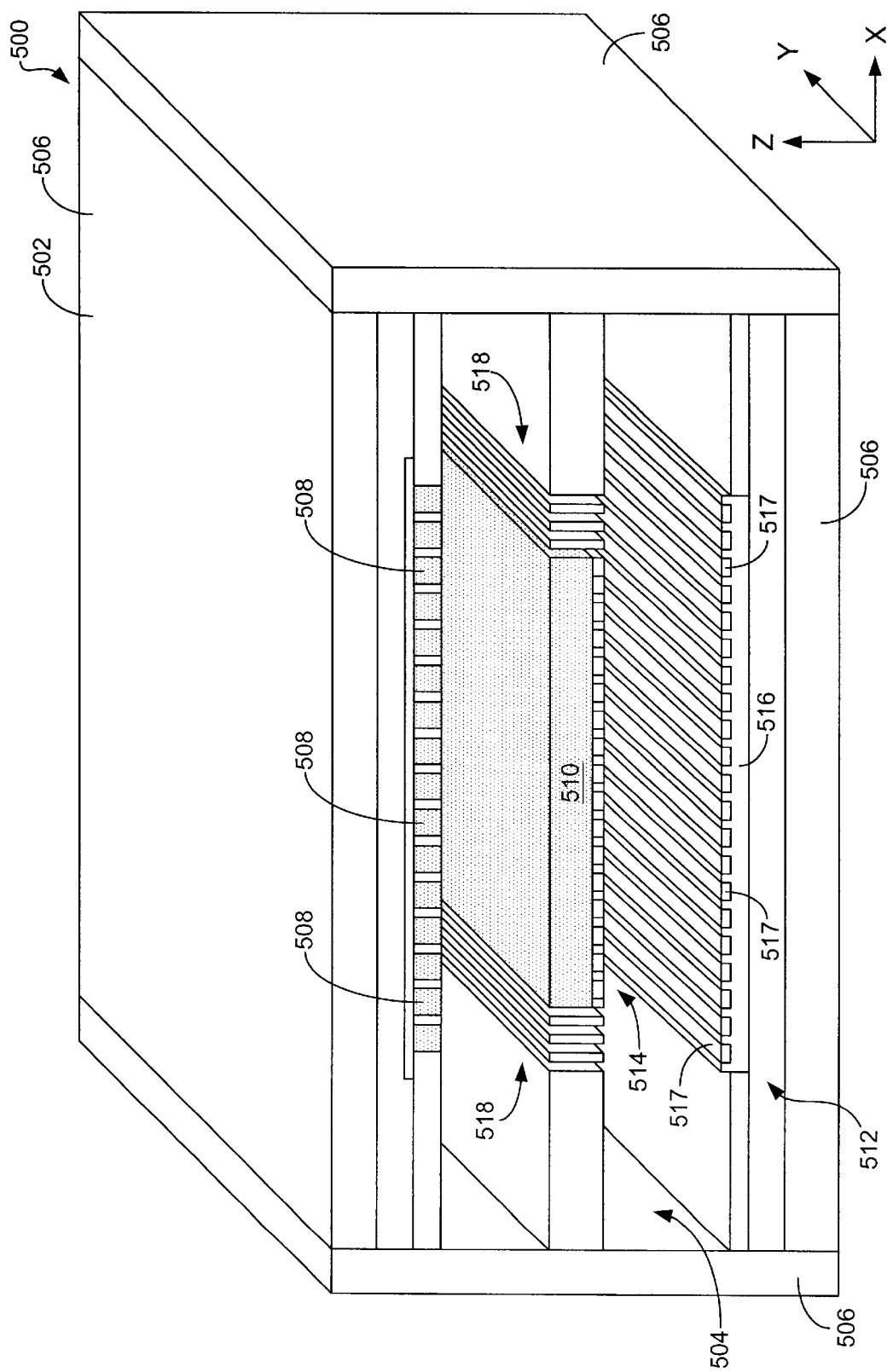
FIG. 7 is a schematic cross-sectional perspective view of the memory device of FIGS. 6 and 7 taken along line 7—7.

Although the memory devices 114 can comprise substantially any device capable of storing a large amount of data, the memory devices, in one embodiment, comprise ARS devices due to their low cost and high capacity. FIGS. 5–7 illustrate the internal structure of one ARS device 500 suitable for construction of the memory devices 114 described above. An example of a suitable ARS device is disclosed and described in detail in U.S. Pat. No. 5,557,596, which is hereby incorporated by reference into the present disclosure. As indicated in FIGS. 5–7 the memory device 500 generally includes an outer casing 502 that forms an interior space 504 therein. By way of example, the casing 502 can include a plurality of walls 506 that define the interior space 504. Typically, the walls 506 of the casing 502 are sealed to each other such that a vacuum can be maintained within the interior space 504. By way of example, the casing 502 maintains a vacuum of at least approximately $10^{-3}$ torr within the interior space 504. Although a particular configuration is shown for the casing 502, it is to be understood that the casing can take many different forms that would be readily apparent to persons having ordinary skill in the art.

Within the interior space 504 is a plurality of electron emitters 508 that face a storage medium 510. As described in relation to FIG. 4, the storage medium 510 comprises a plurality of storage areas (not visible in FIGS. 5–7). In a preferred embodiment, each storage area of the storage medium 510 is responsible for storing one or more bits of data.

The electron emitters 508 are configured to emit electron beam currents toward the storage areas of the storage medium 510 when a predetermined potential difference is applied to the electron emitters. Depending upon the distance between the emitters 508 and the storage medium 510, the type of emitters, and the spot size (i.e., bit size) required, electron optics may be useful in focusing the electron beams. Voltage is also applied to the storage medium 510 to either accelerate or decelerate the emitted electrons and/or to aid in focusing the emitted electrons.

Each electron emitter 508 can serve many different storage areas to write data to and read data from the storage medium 510. To facilitate alignment between each electron emitter 508 and an associated storage area, the electron emitters and storage medium 510 can be moved relative to each other in the X and Y directions noted in FIG. 2. To provide for this relative movement, the memory device 500 can include a micromover 512 that scans the storage medium 510 with respect to the electron emitters 508. As indicated in FIGS. 5 and 7, the micromover 512 can include a rotor 514 connected to the storage medium 510, a stator 516 that faces the rotor, and one or more springs 518 that are positioned to the sides of the storage medium. As is known in the art, displacement of the rotor 514, and thereby the storage medium 510, can be effected by the application of appropriate potentials to electrodes 517 of the stator 516 so as to create a field that displaces the rotor 514 in a desired manner.

When the micromover 512 is displaced in this manner, the micromover scans the storage medium 510 to different locations within the X-Y plane such that each emitter 508 is positioned above a particular storage area. The micromover 512 used preferably has sufficient range and resolution to position the storage areas under the electron emitters 508 with high accuracy. By way of example, the micromover 512 can be fabricated through semiconductor microfabrication processes. Although relative movement between the electron emitters 508 and the storage medium 510 has been described as being accomplished through displacement of the storage medium, it will be understood that such relative movement can alternatively be obtained by displacing the electron emitters or by displacing both the electron emitters and the storage medium. Moreover, although a particular micromover 512 is shown and described herein, it will be appreciated by persons having ordinary skill in the art that alternative moving means could be employed to obtain such relative movement.

Alignment of an emitted beam and storage area can be further facilitated with deflectors (not shown). By way of example, the electron beams can be rastered over the surface of the storage medium 510 by either electrostatically or electromagnetically deflecting them, as through use of electrostatic and/or electromagnetic deflectors positioned adjacent the emitters 508. Many different approaches to deflect electron beams can be found in literature on scanning electron microscopy (SEM).

The electron emitters 508 are responsible for reading and writing information on the storage areas of the storage medium with the electron beams they produce. Therefore, the electron emitters 508 preferably produce electron beams that are narrow enough to achieve the desired bit density for the storage medium 510, and that provide the different power densities needed for reading from and writing to the medium.

As indicated in FIGS. 5 and 6, the memory device 500 can further include one or more supports 520 that support the storage medium 510 in place within the interior space 504. When provided, the supports 520 typically comprise thin-walled microfabricated beams that flex when the storage medium 510 is displaced in the X and/or Y directions. As is further indicated in FIGS. 5 and 6, the supports 520 can each be connected to the walls 506 of the casing 502.

Figure 8:
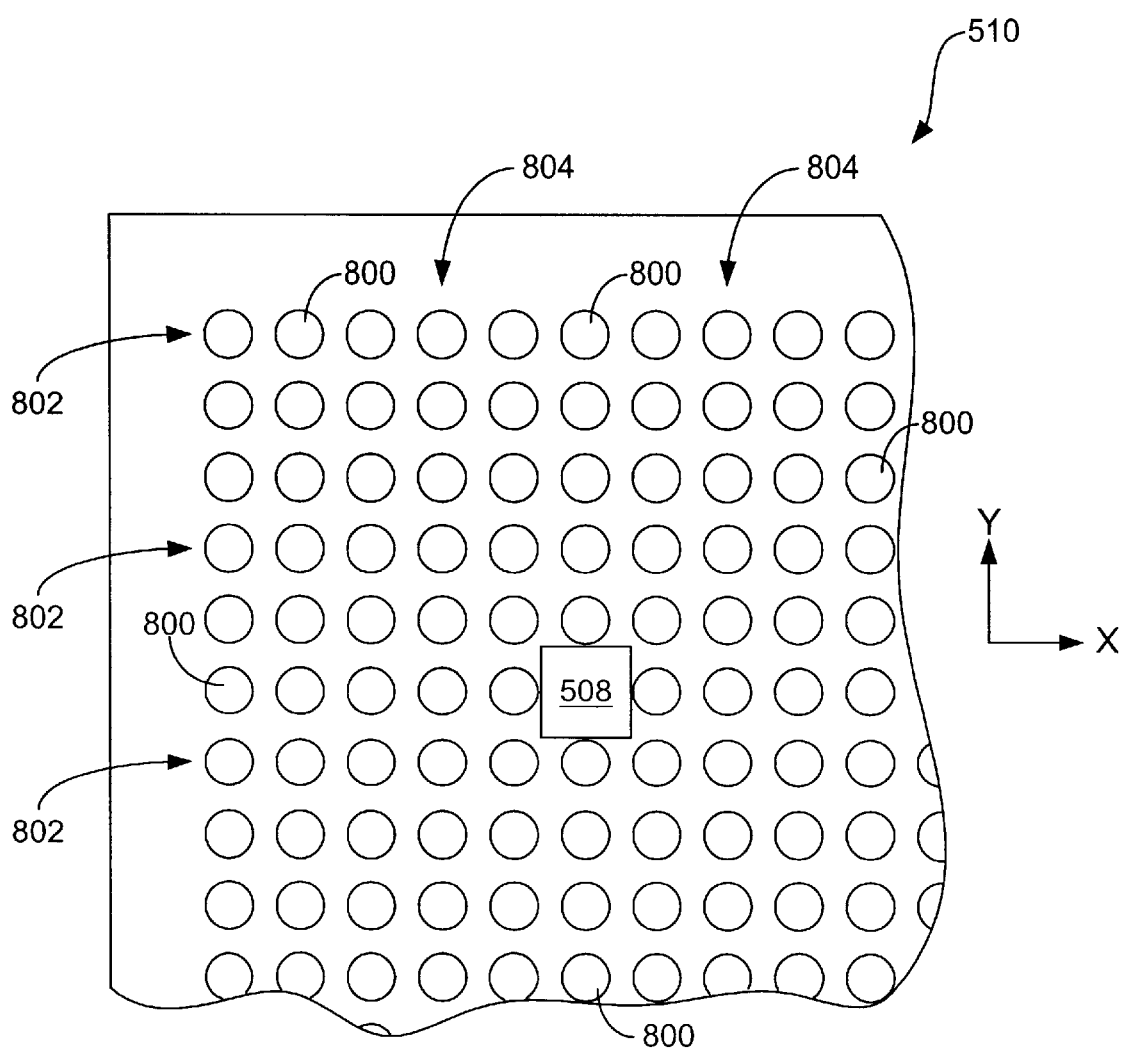
FIG. 8 is a partial schematic view of a storage medium of the memory device shown in FIGS. 5–7.

In a preferred embodiment, the electron emitters 508 are contained within a two-dimensional array comprising a plurality of emitters. By way of example, an array of 100×100 electron emitters 508 can be provided with an emitter pitch of approximately 5 to 100 micrometers in both the X and Y directions. As discussed above, each emitter 508 typically is used to access a plurality of storage areas of the storage medium 510. FIG. 8 provides a schematic representation of this relationship. In particular, this figure illustrates a single electron emitter 508 positioned above a plurality of storage areas 800 of the storage medium 510. As indicated in FIG. 8, the storage areas 800, like the electron emitters 508, are contained in a two-dimensional array. In particular, the storage areas 800 are arranged in separate rows 802 and columns 804 on the surface of the storage medium 510. In a preferred an embodiment, each emitter 508 is only responsible for a portion of the entire length of predetermined numbers of rows 802. Accordingly, each emitter 508 normally can access a matrix of storage areas 800 of particular rows 802 and columns 804. Preferably, each row 802 that is accessed by a single electron emitter 508 is connected to a single external circuit.

To address a storage area 800, the micromover 512 is activated to displace the storage medium 510 (and/or electron emitters 508) to align the storage area with a particular electron emitter. Typically, each emitter 508 can access tens of thousands to hundreds of millions of storage areas 800 in this manner. The storage medium 510 can have a periodicity of approximately 1 to 100 nanometers between any two storage areas 800, and the range of the micromover 512 can be approximately 5–100 micrometers. As will be appreciated by persons having ordinary skill in the art, each of the electron emitters 508 can be addressed simultaneously or in a multiplexed manner. A parallel accessing scheme can be used to significantly increase the data rate of the memory device 500.

Writing with the memory device 500 is accomplished by temporarily increasing the power density of an electron beam produced by an electron emitter 508 to modify the surface state of a storage area 800 of the storage medium 510. For instance, the modified state can represent a "1" bit, while the unmodified state can represent a "0" bit. Moreover, the storage areas can be modified to different degrees to represent more than two bits, if desired. In a preferred embodiment, the storage medium 510 is constructed of a material whose structural state can be changed from crystalline to amorphous by electron beams. An example material is germanium telluride (GeTe) and ternary alloys based on GeTe. To change from the amorphous to the crystalline state, the beam power density can be increased and then slowly decreased. This increase/decrease heats the amorphous area and then slowly cools it so that the area has time to anneal into its crystalline state. To change from the crystalline to amorphous state, the beam power density is increased to a high level and then rapidly reduced. Although temporary modification of the storage medium 510 is described herein, it will be understood that permanent modification is possible where write-once-read-many (WORM) functionality is desired.

Reading is accomplished by observing the effect of the electron beam on the storage area 800, or the effect of the storage area on the electron beam. During reading, the power density of the electron beam is kept low enough so that no further writing occurs. In a first reading approach, reading is accomplished by collecting the secondary and/or backscattered electrons when an electron beam with a relatively low (i.e., lower than that needed to write) power density is applied to the storage medium 510. In that the amorphous state has a different secondary electron emission coefficient (SEEC) and backscattered electron coefficient (BEC) than the crystalline state, a different number of secondary and backscattered electrons are emitted from a storage area 800 when bombarded with a read electron beam. By measuring the number of secondary and backscattered electrons, the state of the storage area 506 can be determined. Example apparatus for reading and writing are described in U.S. Pat. No. 5,557,596.

Figure 9:
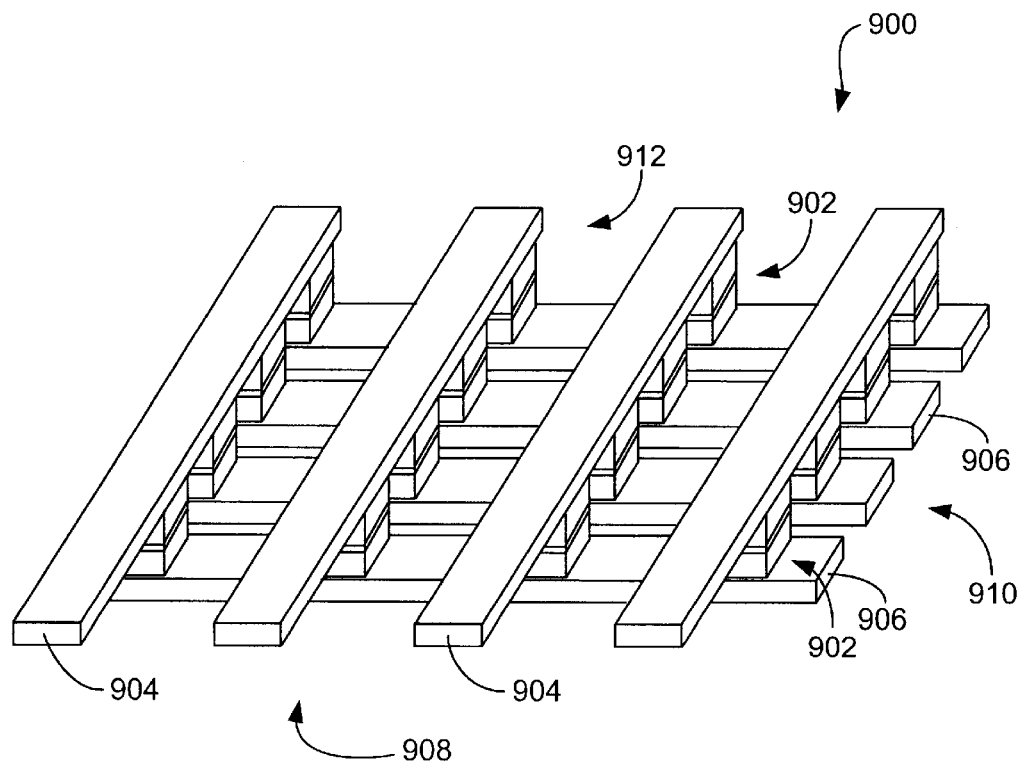
FIG. 9 is a schematic view illustrating an example internal structure of a second memory device that can be used in the storage device shown in FIGS. 1–4.
Figure 10:
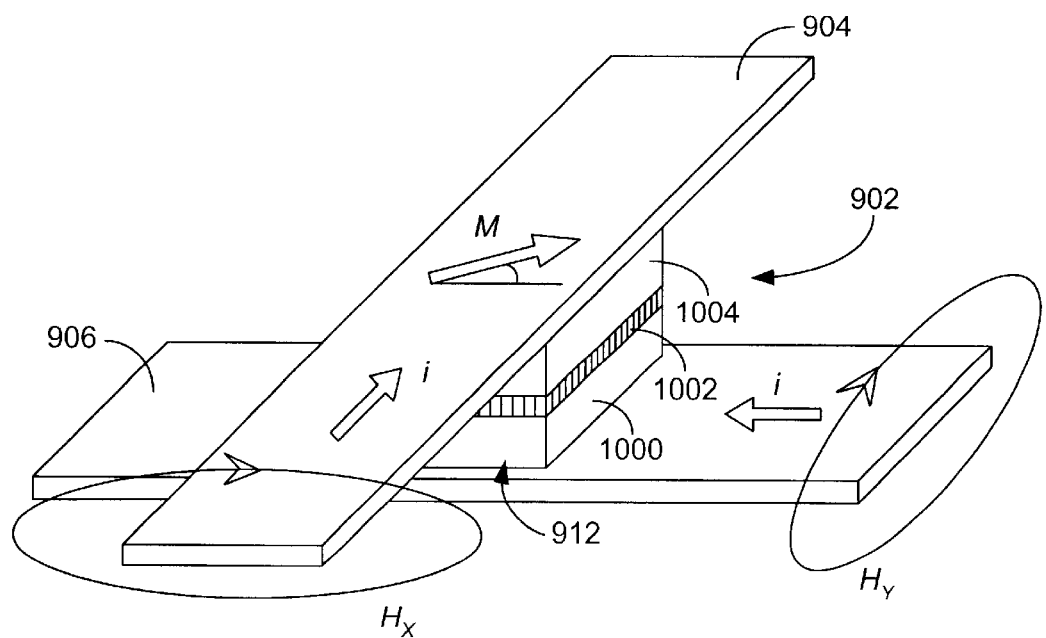
FIG. 10 is a schematic detail view of the memory device shown in FIG. 9.

In an alternative preferred arrangement, the memory devices 514 comprise MRAM devices. Although MRAM devices typically do not have the storage capacity of ARS devices, the use of MRAM devices is advantageous in terms of transfer rate performance in that MRAM devices can write, and read, data with great speed. FIGS. 9 and 10 illustrate the internal structure of an MRAM device 900 suitable for construction of the memory devices 514. As indicated in FIG. 9, the MRAM device 900 is a solid-state device that comprises a plurality of cells 902, which serve as magnetic domains, and a plurality of conductor bars 904 and 906. Typically, the bars 904, 906 are arranged in first and second parallel planes 908 and 910 with the bars of the first plane aligned substantially perpendicularly to the bars of the second plane. Because of this perpendicular arrangement, the bars 904, 906 form cross points 912. As is illustrated in FIG. 9, one cell 902 is normally disposed intermediate the two planes 908, 910 at each cross point 912 formed by the bars 904, 906. Therefore, as shown in the detail view of FIG. 10, each cell 902 is sandwiched between a first bar 904 and a second bar 906 at the two bars' cross point 912. As indicated in FIG. 10, each cell 902 normally comprises a pinned magnetic layer 1000 (i.e., a layer which is permanently magnetized in a predetermined direction), a relatively thin dielectric layer 1002, and a free magnetic sense layer 1004 (i.e., a layer whose magnetization direction can be selectively changed). By way of example, the bars 904, 906 and their associated cells 902 can be formed on one or more substrates to create an integrated device.

In use, writing is accomplished by passing current, i, through the conductor bars 904, 906 to create magnetic fields $H_x$ and $H_y$. These magnetic fields produce resultant vector addition magnetic forces, M, at the crossover points 912 that are sufficient to selectively cause the magnetic orientation of the sense layers 1004 to either coincide with the magnetic direction of the pinned magnetic layer 1000 or to oppose it. Detection of the written state of the sense layer's magnetism can then be accomplished by determining the differential resistance in the tunneling magneto-resistive junction between the two conductor bars 904, 906 through the sense layer 1004, the dielectric layer 1002, and the pinned layer 1000 depending upon the pinned layer's magnetic orientation.

While particular embodiments of the invention have been disclosed in detail in the foregoing description and drawings for purposes of example, it will be understood by those skilled in the art that variations and modifications thereof can be made without departing from the scope of the invention as set forth in the following claims.

What is claimed is:

1. A solid-state storage device, comprising:
    a memory device comprising one of an atomic resolution storage (ARS) device and a magnetic random access memory (MRAM) device;
    a controller including a connector interface, a buffer system, a processor, and a memory device interface; and
    an integral connector that is used to directly connect the storage device to another device.

2. The storage device of claim 1, wherein the connector comprises a universal serial bus (USB) connector.

3. The storage device of claim 2, wherein the connector comprises a type A USB connector.

4. The storage device of claim 2, wherein the connector comprises a type B USB connector.

5. The storage device of claim 1, wherein the connector comprises a plug connector.

6. The storage device of claim 1, wherein the connector comprises a receptacle connector.

7. A solid-state storage device, comprising:
    at least one atomic resolution storage (ARS) device;
    a controller including a connector interface, a buffer system, a processor, and a memory device interface; and
    an integral universal serial bus (USB) connector that is used to directly connect the storage device to another device.

8. The storage device of claim 7, wherein the USB connector comprises a type A USB connector.

9. The storage device of claim 7, wherein the USB connector comprises a type B USB connector.

10. The storage device of claim 7, wherein the connector comprises a plug connector.

11. The storage device of claim 7, wherein the connector comprises a receptacle connector.

12. A solid-state storage device, comprising:
    at least one magnetic random access memory (MRAM) device;
    a controller including a connector interface, a buffer system, a processor, and a memory device interface; and
    an integral universal serial bus (USB) connector that is used to directly connect the storage device to another device.

13. The storage device of claim 12, wherein the USB connector comprises a type A USB connector.

14. The storage device of claim 12, wherein the USB connector comprises a type B USB connector.

15. The storage device of claim 12, wherein the connector comprises a plug connector.

16. The storage device of claim 12, wherein the connector comprises a receptacle connector.

17. A method for facilitating writing and reading data, comprising the steps of:
    providing a storage device including a memory device comprising one of an atomic solution storage (ARS) device and a magnetic random access memory (MRAM) device and a controller including a connector interface, a buffer system, a processor, and a memory device interface; and
    directly connecting the storage device to another device that is to write data to or read a from the storage device using an integral USB connector of the storage device so that the data can be written or read.

* * * * *